United States Patent
Inoguchi

(10) Patent No.: US 6,185,105 B1
(45) Date of Patent: Feb. 6, 2001

(54) DISCHARGE STRUCTURE OF PRINTED CIRCUIT BOARD

(75) Inventor: Yoshitaka Inoguchi, Shizuoka (JP)

(73) Assignee: Yazaki Corporation, Tokyo (JP)

(*) Notice: Under 35 U.S.C. 154(b), the term of this patent shall be extended for 0 days.

(21) Appl. No.: 09/129,998

(22) Filed: Aug. 6, 1998

(30) Foreign Application Priority Data

Aug. 7, 1997 (JP) .................................................. 9-213424

(51) Int. Cl.⁷ .................................................. H05K 7/02
(52) U.S. Cl. ........................ 361/760; 361/763; 361/764; 361/765; 361/766; 174/260; 174/262; 174/263; 228/180.1
(58) Field of Search .......................... 361/760, 763–766, 361/748; 174/260, 262, 263; 228/180.1

(56) References Cited

U.S. PATENT DOCUMENTS

| | | | |
|---|---|---|---|
| 4,088,828 | * 5/1978 | Yamamoto et al. | 174/263 |
| 4,139,881 | * 2/1979 | Shimizu et al. | 361/760 |
| 4,761,881 | * 8/1988 | Bora et al. | 29/840 |
| 4,929,491 | * 5/1990 | Kawakami et al. | 428/195 |
| 5,400,221 | * 3/1995 | Kawaguchi | 361/771 |

FOREIGN PATENT DOCUMENTS

| | | | |
|---|---|---|---|
| 3-261087 | 11/1991 | (JP) | H01T/4/10 |
| 3-297199 | 12/1991 | (JP) | H05K/9/00 |

\* cited by examiner

*Primary Examiner*—Jeffrey Gaffin
*Assistant Examiner*—David Foster
(74) *Attorney, Agent, or Firm*—Sughrue, Mion, Zinn, Macpeak & Seas, PLLC

(57) ABSTRACT

In a printed circuit board, electronic components such as a component having a pair of leading portions, a chip component having a pair of electrodes, and the like, are connected to circuit patterns; and a resist layer covering a copper foil portion formed as a ground pattern is removed in vicinity of the high-impedance side leading portion of the current leading component and the high-impedance side electrode of the chip component to thereby form removed portions so that discharge paths are formed between the copper foil portion exposed through the removed portions and the leading portion and the electrode.

9 Claims, 3 Drawing Sheets

DISCHARGE STRUCTURE OF PRINTED CIRCUIT BOARD

BACKGROUND OF THE INVENTION

1. Field of the Invention

This invention relates to printed circuit boards widely used in various electronic equipments, and particularly relates to a discharge structure of a printed circuit board for discharging static electricity to a ground pattern when static electricity is generated upon supply of input signals or upon connection of the other component.

The present application is based on Japanese Patent Application No. Hei. 9-213424, which is incorporated herein by reference.

2. Description of the Related Art

In various electronic equipments, for example, in an electronic equipment for car control, miniaturized electronic components or integrated circuits (ICs) are formed on a printed circuit board for making the size compact and making the weight light. Such an IC has a tendency that they may be broken easily by static electricity as disclosed in Unexamined Japanese Patent Publication No. Hei. 3-261087 or the like. For example, an IC mounted on a printed circuit board may be broken by static electricity when a finger or the like touches the printed circuit board, when an input signal is supplied to an input terminal of the printed circuit board, or when other electronic components are connected to the printed circuit board.

Therefore, conventionally, various measures have been taken to cope with generation of static electricity, as follows.

First, referring to FIG. 4, a first example of such a conventional measure against static electricity will be described. Input terminals T21 and T22 are provided on a printed circuit board 31, and electronic circuits 32 and 33 constituted by ICs are connected to the input terminals T21 and T22 through resistors R21 and R22 respectively.

Discharging capacitors C21 and C22 are connected between the input sides of the resistors R21 and R22 and a ground pattern (not shown) respectively.

In such a configuration, static electricity generated at or asserted to the input sides of the resistors R21 and R22 are discharged to the ground through the capacitors C21 and C22 respectively. The capacitors may be replaced by discharging surge absorbers or the like.

Next, referring to FIG. 5, a second example of the measure against static electricity will be described. In a printed circuit board 41, a belt-like ground patten 43 of a copper foil portion is formed on one side surface of an insulating substrate 42, and a resist layer 44 of an insulating material is formed on the ground pattern 43. Insertion holes 45 are formed through the printed circuit board 41, so that connection terminals of connectors or the like are inserted through the insertion holes 45 so as to be connected to a circuit pattern (not shown).

The resist layer 44 is partly removed to form removed portions 46 in positions corresponding to lower portions of components (in the vicinity of input terminals). Accordingly, the ground pattern 43 is partly exposed through the removed portions 46.

Next, referring to FIG. 6, a third example of the measure against static electricity will be described. In a printed circuit board 41, a belt-like ground patten 43 of a copper foil portion is formed on one side surface of an insulating substrate 42, and a resist layer 44 of an insulating material is formed on the surface of the ground pattern 43. Insertion holes 45 are formed through the printed circuit board 41, so that connection terminals of connectors or the like are inserted through the holes 45 so as to be connected to a circuit pattern (not shown).

The resist layer 44 is partly removed to form a belt-like removed portion 47 in a position corresponding to a lower portion of components (in the vicinity of input terminals). Accordingly, the ground pattern 43 is slenderly exposed through the removed portion 46.

In the first example of the discharge measure against static electricity, however, it is necessary to provide components such as the capacitors C21 and C22, surge absorbers, or the like, so that the number of components and the number of work steps increase. Further, static electricity often exhibits a high voltage instantaneously so that the capacitors may be broken by such a high voltage applied thereto. Thus, there is a problem in durability.

On the other hand, in the printed circuit boards 41 illustrated as the second and third examples of the discharge measure against static electricity, the removal portions 40 and 47 are formed to expose the ground pattern to allow discharge. However, since the impedance of the input terminals is low, discharge can not be generated from the input terminals to the ground pattern.

Further, with respect to prevention of breaking of electronic equipments due to static electricity, the above-mentioned Unexamined Japanese Patent Publication No. Hei. 3-261087 discloses "Electrostatic Breaking Preventing Apparatus" and Unexamined Japanese Patent Publication No. Hei. 3-297199 discloses "Electric Apparatus".

In the above "Electrostatic Breaking Preventing Apparatus", a ground pattern is formed on a printed circuit board and a protrusion for accelerating discharge of static electricity is formed at a position of a part of the ground pattern facing an input pattern. However, the input pattern and the ground pattern do not face each other three-dimensionally but only portions of the thin patterns formed on one and the same plane are made adjacent to each other. Accordingly, the discharge effect with respect to the input pattern is not good. In addition, there is a possibility that static electricity due to approach of a finger, a component or the like cannot be discharged.

Further, in the above "Electric Apparatus", an electrostatic come-flying copper foil portion (circuit pattern) is formed on a printed circuit board so that static electricity generated when operating components are mounted is discharged to the electrostatic come-flying foil. However, no consideration is given to discharge of static electricity due to input signal supply.

SUMMARY OF THE INVENTION

It is an object of the present invention to provide a discharge structure of a printed circuit board which is attained in view of the above problems so that static electricity in a high impedance circuit of an electronic apparatus can be discharged surely to a ground pattern so that the printed circuit board is never affected by static electricity.

In order to achieve the above object, according to an aspect of the present invention, there is provided a discharge structure for discharging static electricity which comprises: a printed circuit board comprising: an insulating substrate, an electrically conductive layer formed on the insulating substrate, the electrically conductive layer including a circuit pattern, and a resist layer by which the printed circuit board is partially covered; and an electronic component including a body and at least two terminal portions in electrical contact with the circuit pattern; wherein a ground pattern of the circuit pattern is partially exposed through a removed portion which is formed in vicinity of one of the terminal portions connected through the body and the other one of the terminal portions of the electronic component to a high-impedance side on the circuit pattern.

In the above discharge structure of a printed circuit board, the resist layer covering the electrically conductive layer formed as a ground pattern is partially removed to form the removed portion so that the ground pattern is exposed partially in the vicinity of one of leading portions or one of electrodes of the electronic component connected to a high impedance portion on the circuit pattern.

Accordingly, the high-impedance side leading portion or the electrode is in opposition to the ground pattern exposed through the removed portion, without interposition of the insulating resist layer, and further, the opposing positions are arranged three-dimensionally. Accordingly, when an input signal is applied to the printed circuit board or when any other components are approached to the printed circuit board, static electricity is discharged in a position of high impedance. Thus, in accordance with the discharge of static electricity to specific portions, various components can be protected and maloperation due to static electricity can be surely prevented.

DETAILED DESCRIPTION OF THE PREFERRED EMBODIMENT

Figure 1:
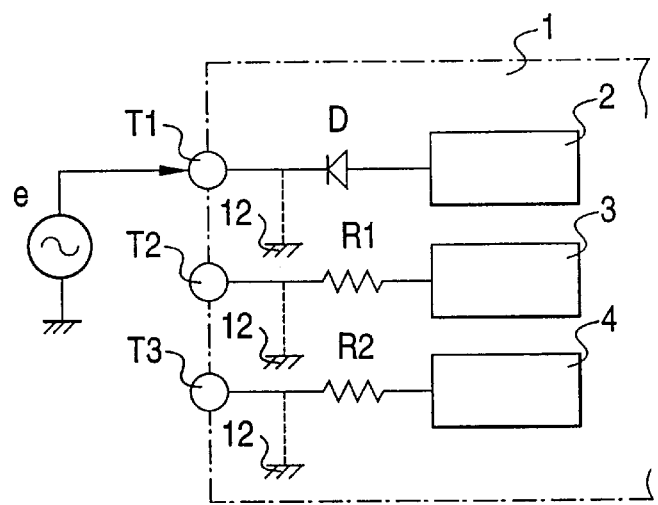
FIG. 1 is a partial circuit diagram showing an embodiment of the discharge structure of a printed circuit board according to the present invention.
Figure 2:
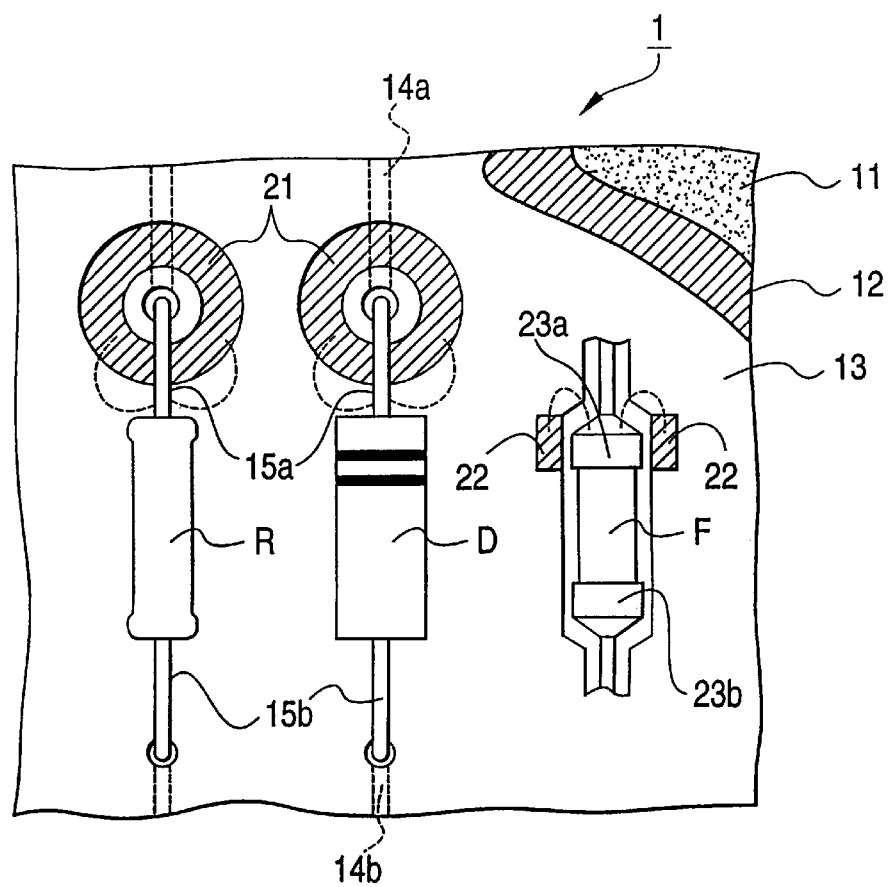
FIG. 2 is a partial plan view showing a main part of the printed circuit board of FIG. 1.
Figure 3:
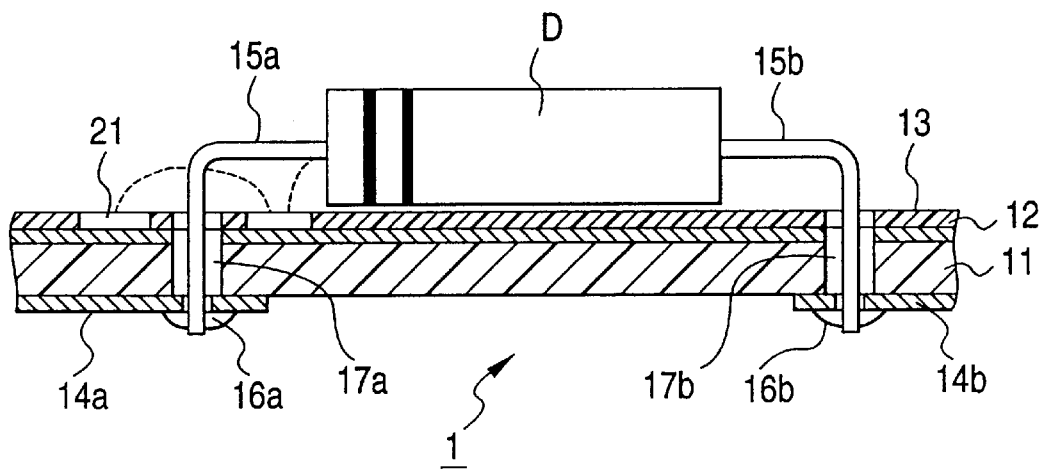
FIG. 3 is a partial sectional view showing a main part of the printed circuit board of FIG. 2.
Figure 4:
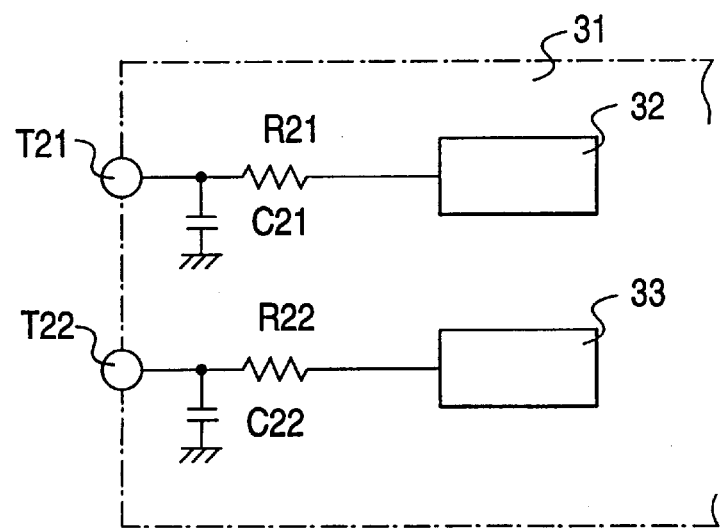
FIG. 4 is a partial circuit diagram showing a first example of the conventional printed circuit board.
Figure 5:
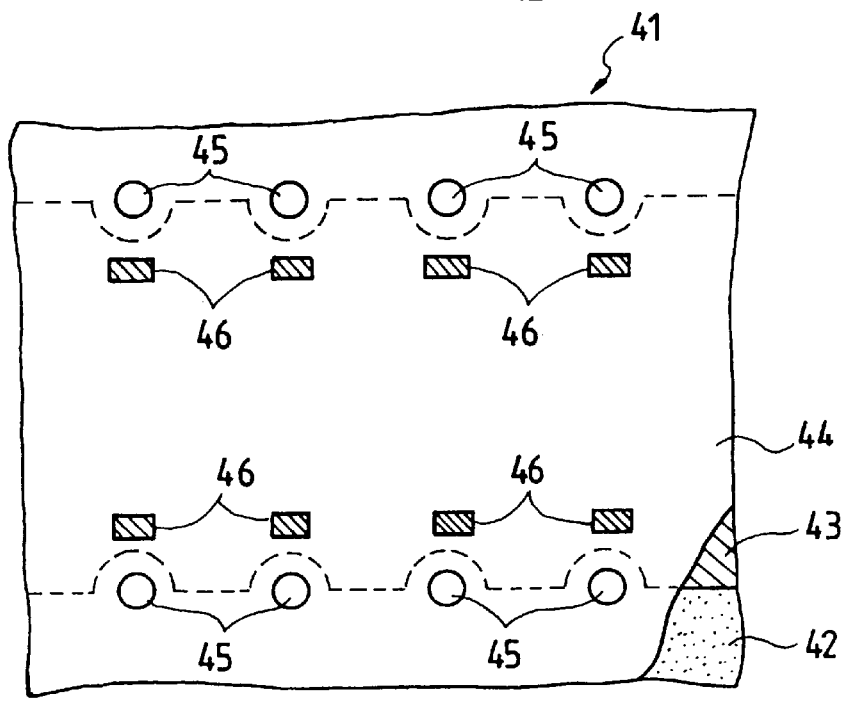
FIG. 5 is a partial plan view showing a second example of the conventional printed circuit board.
Figure 6:
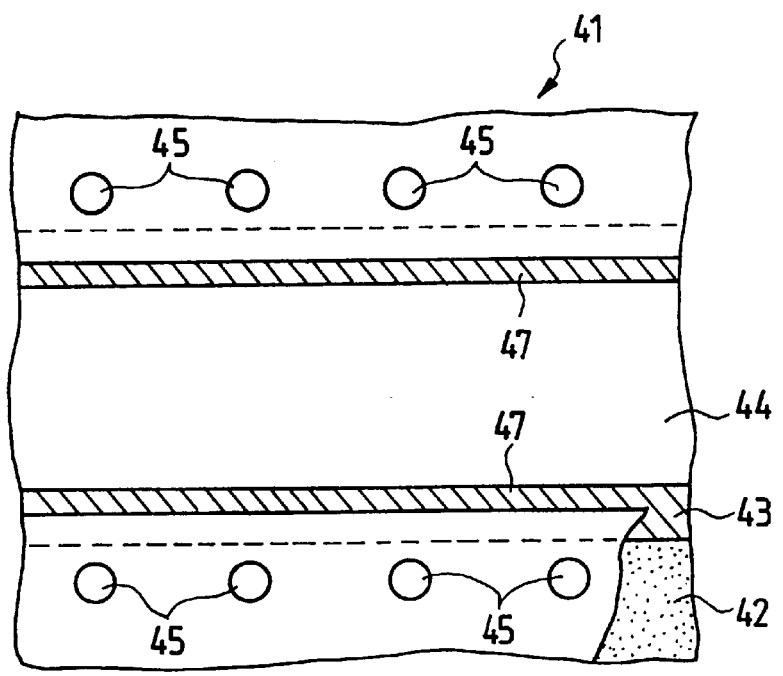
FIG. 6 is a partial plan view showing a third example of the conventional printed circuit board.

Referring to FIGS. 1 to 3, an embodiment of the discharge structure of a printed circuit board according to the present invention will be described in detail. FIG. 1 is a circuit diagram typically illustrating the discharge structure of a printed circuit board according to the present invention, FIG. 2 is a plan view showing a main part of the printed circuit board of FIG. 1, and FIG. 3 is a sectional view of the printed circuit board of FIG. 2.

As shown in FIG. 1, a printed circuit board 1 comprises input terminals T1, T2 and T3 connected to various electronic circuit blocks 2, 3 and 4 which are control circuits or the like through a diode D, a resistor R1 and a resistor R2, respectively. In the electronic components according to the embodiment, each of the diode D, the resistor R1 and the resistor R2 corresponds to a component having a pair of leading portions 15a, 15b as shown in FIG. 2. An input signal e is supplied or another electronic component is connected to the input terminals T1, T2 and T3, as shown in FIG. 1 by way of example.

The input impedance is set to be high, and a discharge path is formed at an input side of each of the diode D, the resistor R1 and the resistor R2 as indicated by broken lines in this embodiment so that static electricity is discharged by utilizing the high impedance.

Further, as shown in FIG. 2, a high-impedance chip component F having a pair of electrodes 23a and 23b, which is different from the above-mentioned components, is connected on the printed circuit board 1.

As shown in FIGS. 2 and 3, the printed circuit board 1 of the embodiment comprises an insulating substrate 11, a copper foil portion 12 that is a ground pattern of an electrically conductive layer is formed on the insulating substrate 11 for the purpose of grounding and discharging, and a resist layer 13 that is an insulating film and covers the surface of the copper foil portion 12. Wiring circuit patterns 14a and 14b are formed on the under side of the printed circuit board 1, and ends of leading portions 15a and 15b of the component (diode) D are electrically connected to the circuit patterns 14a and 14b by means of soldering portions 16a and 16b respectively as shown in FIG. 3.

Lead insertion holes 17a and 17b are formed through the insulating substrate 11, the copper foil portion 12, and the resist layer 13. The leading portions 15a and 15b are inserted through the insertion holes 17a and 17b without contacting the insulating substrate 11, the copper foil portion 12, and the resist layer 13. The leading portions 15a and 15b are soldered to the circuit patterns 14a and 14b without contacting the copper foil portion 12 so that the short-circuit failure of the leading portions 15a and 15b can be prevented.

As described above, discharge paths for discharging static electricity at the time when an input signal e is supplied to or another component is connected to each of the input terminals T1 to T3 are formed on the input sides of the components, such as a diode D, a resistor R1, or a resistor R2. That is, the discharge paths are formed on the connection sides of those components connected to the input terminals T1, T2 and T3. As shown in FIGS. 2 and 3, with respect to each of the component D, R1 and R2, a removed portion 21 is formed around the lead insertion hole 17a so that the resist layer 13 is removed in an annular manner. Accordingly, a discharge path is formed between the leading portion 15a and the copper foil portion 12 exposed through the removed portion 21 as indicated by a broken line in FIGS. 1 to 3.

Accordingly, even if static electricity is produced when an input signal e is supplied to or another component is connected to any of the input terminals T2 and T3, the static electricity is discharged through the path indicated by the broken line so that the components D, R1 and R2, and the electronic circuits 3 and 4 are protected and maloperation is prevented. Further, since the removed portion 21 is formed in the annular manner, the resist layer 13 is left as a flat circular portion around the leading portion 15a as shown in FIGS. 2 and 3. Accordingly, there is no chance that the leading portion 15a contacts directly with the copper foil portion 12 so that short-circuit failure can be prevented from occurring.

Next, description will be made about the discharge path of the chip component F. With respect to such a chip component F as shown in FIG. 2, removed portions 22 and 22 are formed on the opposite sides of the chip component F at an input side thereof so that discharge paths are formed as indicated by broken lines between the input side electrode 23a and the exposed copper foil portion 12 exposed through the removed portions 22. Accordingly, similarly to the case of the aforementioned components, static electricity can be discharged to the copper foil portion 12 exposed through the removed portions 22 when an input signal is supplied to the input side of the chip component F or when other components are connected to the input side of the same. Accordingly, the chip component F, and the electronic circuit connected to the output side of the chip component F can be prevented from being broken.

In the printed circuit board of this embodiment, as described above, leading portions of a component or electrodes of a chip component are provided three-dimensionally with respect to the planar ground pattern, and discharge paths are formed from the high-impedance side leading portions of the components or from the high-impedance side electrode of the chip component to the exposed copper foil portion. Accordingly, compared with a discharge path simply formed of a plane or a point, static electricity can be surely discharged when an input signal is supplied or when another electronic component of synthetic resin is approached to the printed circuit board.

As described above, in the discharge structure of a printed circuit board according to the present invention, a resist layer covering a copper foil portion formed as a ground pattern in the vicinity of one of the leading portions or one of the electrodes connected to a high impedance portion on the circuit pattern is partly removed to form removed portions so that static electricity is discharged from the one leading portion or one electrode to the copper foil portion exposed by the removed portions.

Accordingly, the high-impedance side leading portion or high-impedance side electrode is in opposition, without interposition of the insulating resist layer, to the copper foil portion formed as a ground pattern, and the opposing positions are arranged three-dimensionally. Accordingly, at the time when input signals are applied, or when components are approached, static electricity is discharged in a position of high impedance. Thus, by discharging static electricity to specific portions, various electronic components can be protected and maloperation due to static electricity can be surely prevented.

What is claimed is:

1. A discharge structure for discharging static electricity, comprising:.
    a printed circuit board comprising: an insulating substrate,
        an electrically conductive layer formed on the insulating substrate, the electrically conductive layer including a circuit pattern, and
        a resist layer by which the printed circuit board is partially covered; and
    an electronic component including a body and at least two terminal portions in electrical contact with the circuit pattern;
    wherein a ground pattern of the circuit pattern is partially exposed through a removed portion which is formed in vicinity of one of the terminal portions connected through the body and the other one of the terminal portions of the electronic component to a high-impedance side on the circuit pattern.

2. The discharge structure of claim 1, wherein when static electricity is applied onto the circuit pattern, the static electricity is caused to discharge onto the ground pattern at the removed portion through the one of the terminal portions of the electronic component.

3. The discharge structure of claim 1, wherein the ground pattern is electrically connected to a ground side of a power supply for supplying an electric power to the circuit pattern.

4. The discharge structure of claim 3, wherein the high-impedance side on the circuit pattern is higher in impedance than a side on the circuit pattern at which the one of the terminal portions of the electronic component is located.

5. The discharge structure of claim 1, wherein the high-impedance side on the circuit pattern is higher in impedance than a side on the circuit pattern at which the one of the terminal portions of the electronic component is located.

6. A discharge structure for discharging static electricity, comprising:
    a printed circuit board including:
        an insulating substrate,
        an electrically conductive layer formed on the insulating substrate, the electrically conductive layer including a circuit pattern, and
        a resist layer by which the printed circuit board is partially covered;
    an electronic component including a body and at least two terminal portions in electrical contact with the circuit pattern, wherein the terminal portions are connected to each other through the body;
    a ground pattern partially forming the circuit pattern; and
    discharging means for causing static electricity on the circuit pattern to discharge onto the ground pattern from one of the terminal portions of the electronic component, the discharging means including a part of the ground pattern which is disposed adjacent to the one of the terminal portions,
    wherein the one of the terminal portions of the electronic component is electrically connected, through the body and the other one of the terminal portions, to a high-impedance side on the circuit pattern.

7. The discharge structure of claim 6, wherein the ground pattern is electrically connected to a ground side of a power supply for supplying an electric power to the circuit pattern.

8. The discharge structure of claim 7, wherein the high-impedance side on the circuit pattern is higher in impedance than a side on the circuit pattern at which the one of the terminal portions of the electronic component is located.

9. The discharge structure of claim 6, wherein the high-impedance side on the circuit pattern is higher in impedance than a side on the circuit pattern at which the one of the terminal portions of the electronic component is located.

* * * * *